United States Patent
Kim et al.

(10) Patent No.: US 8,288,819 B2
(45) Date of Patent: Oct. 16, 2012

(54) SEMICONDUCTOR DEVICE WITH BULB-TYPE RECESSED CHANNEL AND METHOD FOR FABRICATING THE SAME

(75) Inventors: Yong Soo Kim, Ichon-shi (KR); Hong Seon Yang, Ichon-shi (KR); Se Aug Jang, Ichon-shi (KR); Seung Ho Pyi, Ichon-shi (KR); Kwon Hong, Ichon-shi (KR); Heung Jae Cho, Ichon-shi (KR); Kwan Yong Lim, Ichon-shi (KR); Min Gyu Sung, Ichon-shi (KR); Seung Ryong Lee, Ichon-shi (KR); Tae Yoon Kim, Ichon-shi (KR)

(73) Assignee: Hynix Semiconductor Inc., Icheon-Si (KR)

( * ) Notice: Subject to any disclaimer, the term of this patent is extended or adjusted under 35 U.S.C. 154(b) by 37 days.

(21) Appl. No.: 12/953,255

(22) Filed: Nov. 23, 2010

(65) Prior Publication Data
US 2011/0068380 A1     Mar. 24, 2011

Related U.S. Application Data

(62) Division of application No. 11/862,453, filed on Sep. 27, 2007, now Pat. No. 7,838,364.

(30) Foreign Application Priority Data

Sep. 29, 2006 (KR) .......................... 10-2006-0096359
Sep. 29, 2006 (KR) .......................... 10-2006-0096523

(51) Int. Cl.
*H01L 21/336* (2006.01)

(52) U.S. Cl. .................................... 257/330; 257/E29.201
(58) Field of Classification Search .................. None
See application file for complete search history.

(56) References Cited

U.S. PATENT DOCUMENTS

| | | | |
|---|---|---|---|
| 6,211,549 B1 | 4/2001 | Funaki et al. | |
| 6,312,993 B1 | 11/2001 | Hshieh et al. | |
| 6,380,583 B1 | 4/2002 | Hsieh et al. | |
| 6,573,154 B1 | 6/2003 | Sridhar et al. | |
| 7,525,133 B2 | 4/2009 | Ohta et al. | |
| 8,048,742 B2 * | 11/2011 | Lim et al. | 438/270 |
| 2001/0023960 A1 | 9/2001 | Soga et al. | |
| 2004/0007737 A1 | 1/2004 | Cho et al. | |
| 2004/0121620 A1 | 6/2004 | Pomarede et al. | |
| 2004/0129942 A1 | 7/2004 | Divakaruni et al. | |
| 2006/0113590 A1 | 6/2006 | Kim et al. | |
| 2006/0289931 A1 | 12/2006 | Kim et al. | |
| 2008/0023753 A1 | 1/2008 | Choi et al. | |

FOREIGN PATENT DOCUMENTS

JP        61-032569        2/1986
(Continued)

*Primary Examiner* — Benjamin Sandvik
(74) *Attorney, Agent, or Firm* — Kilpatrick, Townsend & Stockton LLP

(57) ABSTRACT

A method for fabricating a semiconductor device includes providing a substrate having a bulb-type recessed region, forming a gate insulating layer over the bulb-type recessed region and the substrate, and forming a gate conductive layer over the gate insulating layer. The gate conductive layer fills the bulb-type recessed region. The gate conductive layer includes two or more conductive layers and a discontinuous interface between the conductive layers.

5 Claims, 13 Drawing Sheets

FOREIGN PATENT DOCUMENTS

| | | |
|---|---|---|
| JP | 02-014548 | 1/1990 |
| KR | 1999-0061107 | 7/1999 |
| KR | 1020000060693 A | 10/2000 |
| KR | 1020020055938 A | 7/2002 |
| KR | 1020060023308 A | 3/2006 |
| KR | 1020060058959 A | 6/2006 |
| KR | 1020070030022 A | 3/2007 |
| KR | 1020070034651 A | 3/2007 |

* cited by examiner

HEAT TREATMENT

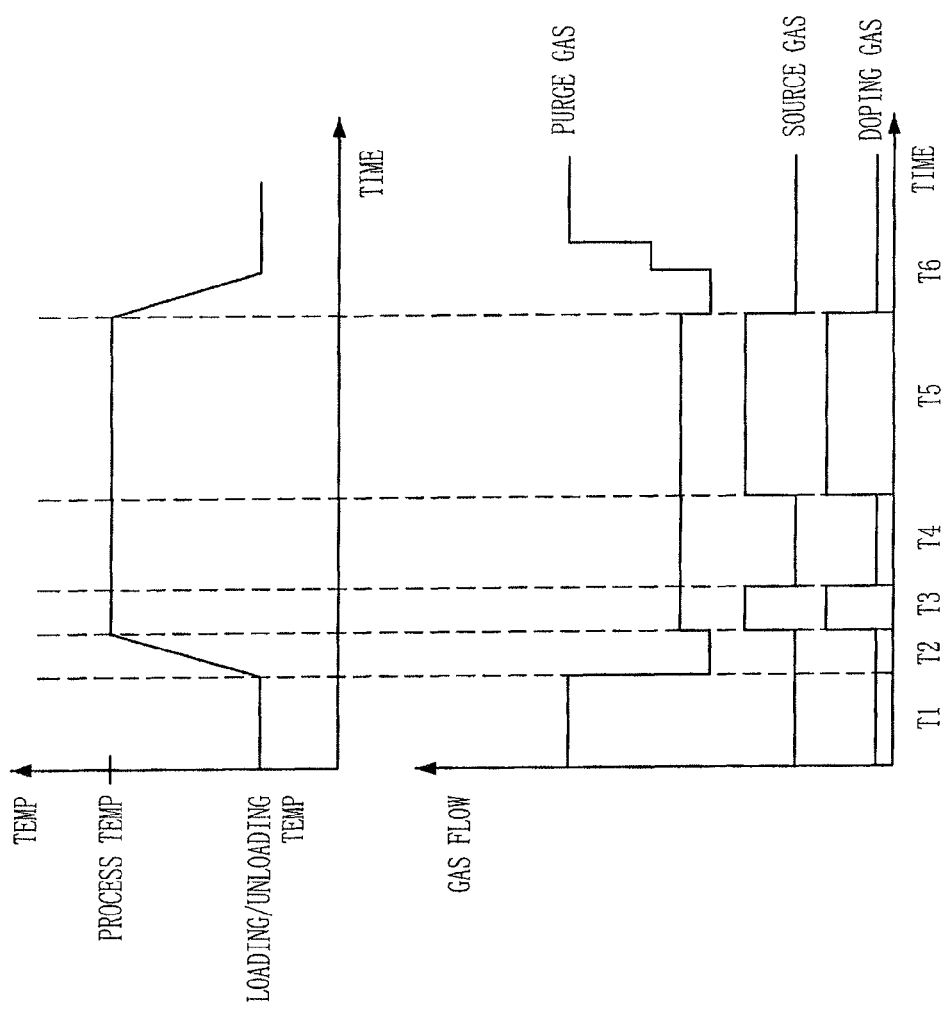

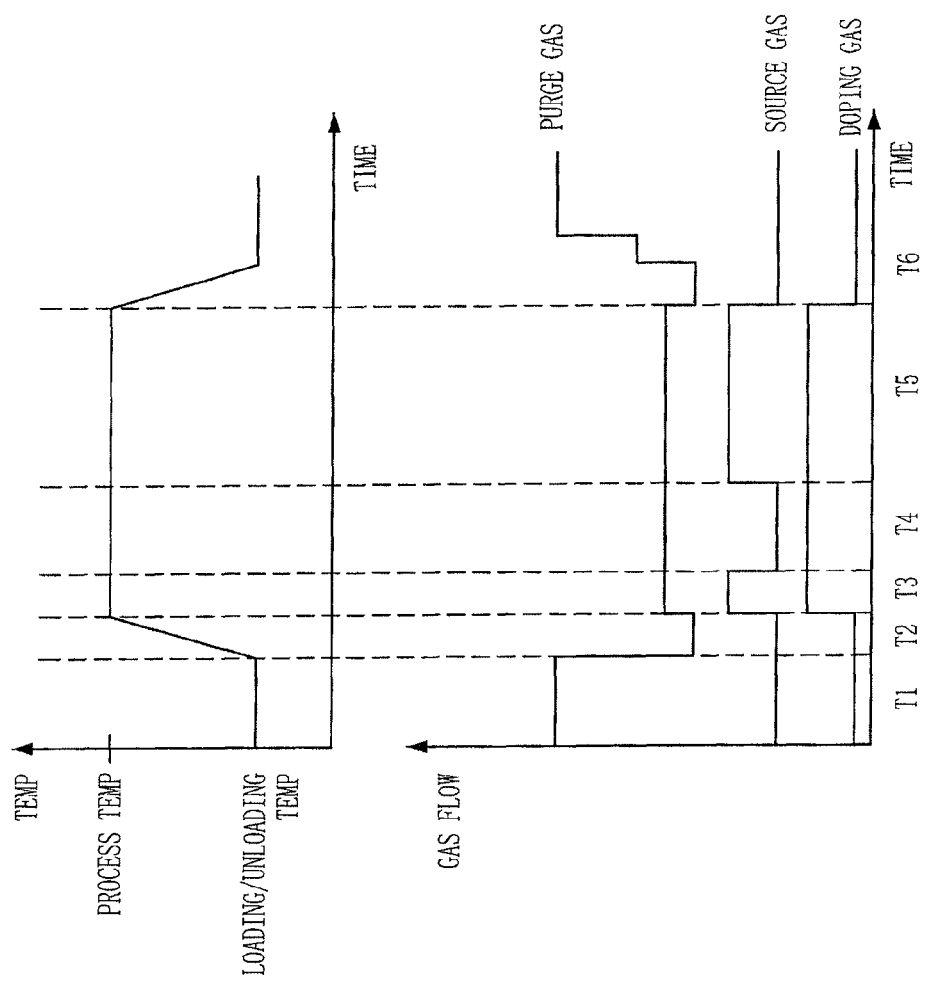

US 8,288,819 B2

SEMICONDUCTOR DEVICE WITH BULB-TYPE RECESSED CHANNEL AND METHOD FOR FABRICATING THE SAME

CROSS-REFERENCE TO RELATED APPLICATIONS

The present invention is a divisional of U.S. patent application Ser. No. 11/862,453, filed on Sep. 27, 2007, which claims priority of Korean patent application numbers 10-2006-0096359 and 10-2006-0096523, both filed on Sep. 29, 2006, which are incorporated by reference in their entirety.

BACKGROUND OF THE INVENTION

The present invention relates to a method for fabricating a semiconductor device, and more particularly to a method for forming a transistor with a bulb-type recessed channel in a semiconductor device.

As dynamic random access memory (DRAM) devices become highly integrated, memory array transistor devices with a design rule of 100 nm or less are in demand. However, the array transistor of 100 nm or less has a very low threshold voltage characteristic due to a short channel effect. Thus, retention time decreases.

A transistor including a recessed channel has been developed in order to solve the above described limitations. The transistor including a recessed channel has a very long retention time characteristic, since it has a very long channel length unlike a typical planar type transistor.

Recently, a method to extend a length of the recessed channel has been proposed to obtain better data retention time and current characteristics than those of the recessed channel. To extend the length of the recessed channel, a bottom portion of a trench for forming the recessed channel is additionally etched to obtain a ball shape. Thus, a bulb-type recessed channel is formed. A transistor including the bulb-type recessed channel is referred to as a bulb-type recessed channel array transistor (BRCAT).

FIG. 1 illustrates a method for fabricating a transistor with a conventional bulb-type recessed channel. A bulb-type recessed region including a trench pattern 12A and a ball pattern 12B is formed over a substrate 11. A gate insulating layer 13 is formed over the surface profile of the bulb-type recessed region and the substrate 11. A gate conductive layer 14 for use as a gate electrode is formed over the gate insulating layer 13 and fills in the bulb-type recessed region. The gate electrode 14 may include polysilicon.

However, when forming the conventional bulb-type recessed channel, the ball pattern 12B has a wider width than the trench pattern 12A in the bulb-type recessed region. Thus, the gate conductive layer 14 may not completely fill the ball pattern 12B during formation. Consequently, a void V may be formed in the middle of the ball pattern 12B. As the gate conductive layer 14 is recrystallized by a subsequent high temperature thermal process, the void may move toward the gate insulating layer 13. The void may result in a portion where the gate insulating layer 13 and the gate conductive layer 14 are not directly in contact with each other.

FIG. 2A illustrates a cross-sectional view of a movement of the void after the subsequent high temperature thermal process is performed and FIG. 2B illustrates a micrographic view of the movement of the void after the subsequent high temperature thermal process is performed. The subsequent high temperature thermal process is performed at a temperature ranging from approximately 650° C. to approximately 1,050° C. The gate conductive layer 14 includes polysilicon. The void moves from the middle of the ball pattern 12B to an interface of the gate insulating layer 13 during the subsequent high temperature thermal process. Thus, the void may contact the gate insulating layer 13.

The void moves because vacancies melted in equilibrium in the gate conductive layer 14 cause growing and moving of the void during a subsequent thermal process. The vacancy is a lattice defect in a crystal lattice where an atom is missing. Specifically, the void is a portion where the gate conductive layer 14 does not contact the interface of the gate insulating layer 13. Thus, the portion, i.e. the void, may result in a decrease of channel capacitance, causing a drain current to decrease. Moreover, a threshold voltage may be difficult to control due to the void.

SUMMARY OF THE INVENTION

Embodiments of the present invention are directed to a bulb-type recessed channel in semiconductor device, which can prevent growing and moving of a void due to a subsequent thermal process in the middle of a ball pattern, and a method for fabricating the same.

In accordance with an aspect of the present invention, a method for fabricating a semiconductor device is provided. The method includes providing a substrate having a bulb-type recessed region. A gate insulating layer is formed over the bulb-type recessed region and the substrate. A gate conductive layer is formed over the gate insulating layer such that the bulb-type recessed region is filled in. The gate conductive layer includes two or more conductive layers and a discontinuous interface between the conductive layers.

In accordance with another aspect of the present invention, a semiconductor device is provided. The semiconductor device includes a substrate, a bulb-type recessed region formed in the substrate, a gate insulating layer formed over the bulb-type recessed region and the substrate, and a gate conductive layer formed over the gate insulating layer and filling in the bulb-type recessed region. The gate conductive layer includes two or more conductive layers and a discontinuous interface between the conductive layers.

In accordance with still another aspect of the present invention, there is provided a method for fabricating a semiconductor device, the method comprising providing a substrate having a bulb-type recessed region, forming a gate insulating layer over the bulb-type recessed region and the substrate, forming a first gate conductive layer having a first thickness over the gate insulating layer, performing a thermal treatment on the first gate conductive layer, and forming a second gate conductive layer having a second thickness over the first gate conductive layer, wherein the second gate conductive layer fills the bulb-type recessed region, wherein a discontinuous interface is formed between the first gate conductive layer and the second gate conductive layer.

In accordance with further still another aspect of the present invention, there is provided a method for fabricating a semiconductor device, the method comprising providing a substrate having a bulb-type recessed region, forming a gate insulating layer over the bulb-type recessed region and the substrate, providing a source gas on the gate insulating layer to form a first gate conductive layer having a first thickness, temporarily stopping providing the source gas, and providing the source gas again to form a second gate conductive layer having a second thickness over the first gate conductive layer, wherein the second gate conductive layer fills the bulb-type recessed region, wherein a discontinuous interface is formed between the first gate conductive layer and the second gate conductive layer.

The first and the second gate conductive layers include a silicon layer formed by the source gas including a silicon compound gas. The silicon layer includes a crystalline layer or an amorphous layer.

In the above, when the source gas is provided, a doping gas and a purge gas are simultaneously supplied.

In accordance with one embodiment, when providing the source gas is temporarily stopped, the supply of the doping gas is temporarily stopped and the supply of the purge gas is continued.

In accordance with another embodiment, when providing the source gas is temporarily stopped, the supply of the doping gas and the supply of the purge gas is continued.

BRIEF DESCRIPTION OF THE DRAWINGS

FIGS. 7A to 7B illustrate graphs showing a method for temporarily stopping the supply of a source gas in accordance with the second embodiment of the present invention.

DESCRIPTION OF SPECIFIC EMBODIMENTS

The present invention relates to a transistor with a bulb-type recessed channel in a semiconductor device and a method for fabricating the same. When a silicon layer is deposited as a material for a gate conductive layer to fill a bulb-type recessed region, a discontinuous interface is generated inside of the silicon layer by performing a thermal treatment in the middle of a deposition according to a first embodiment of the present invention or by stopping the supply of a source gas in the middle of the deposition according to a second embodiment of the present invention. Thus, once the discontinuous interface is formed, even though a void is formed while the gate conductive layer is deposited to fill the bulb-type recessed region, growing and moving of the void due to a subsequent thermal process can be prevented.

Figure 1:
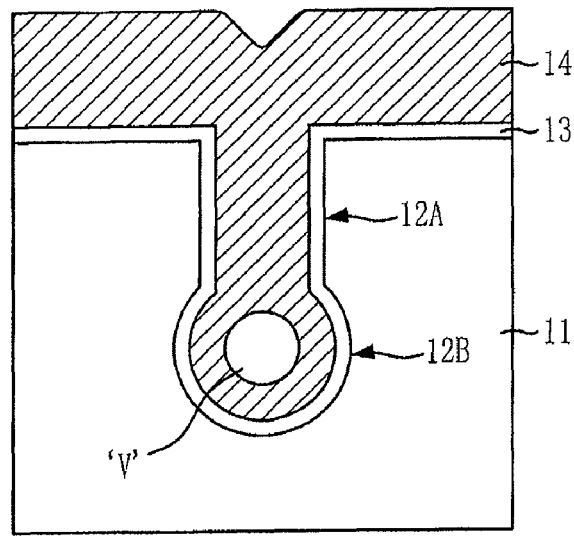
FIG. 1 illustrates a cross-sectional view of a conventional method for fabricating a transistor with a bulb-type recessed channel.
Figure 2A:
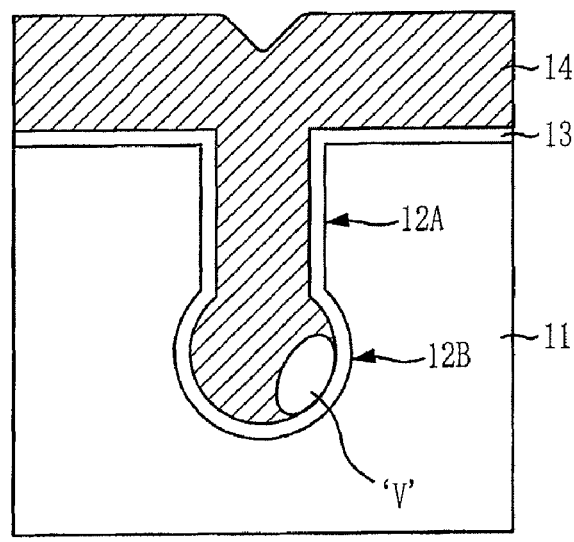
FIGS. 2A and 2B illustrate a cross-sectional view and a micrographic view of a movement of a void after a high temperature thermal process is performed.
Figure 2B:
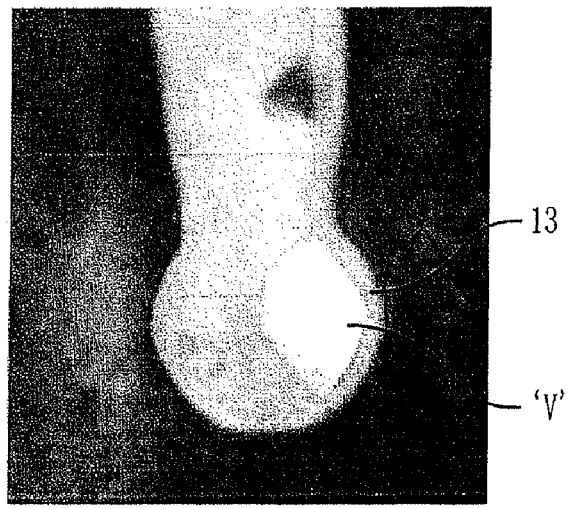
Figure 3:
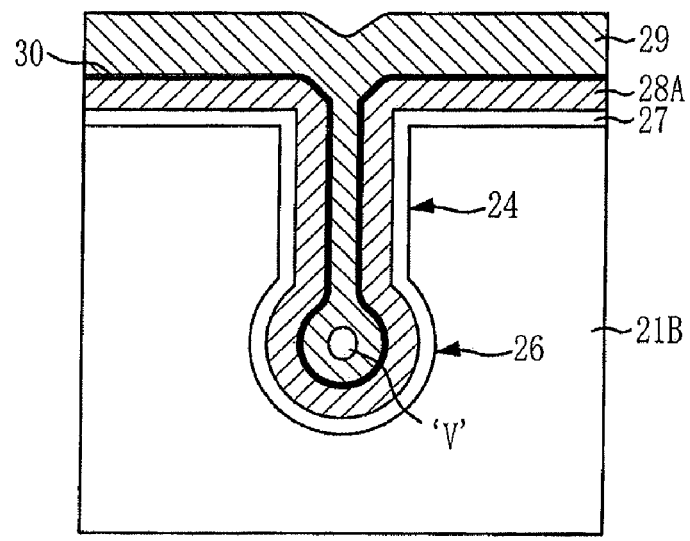
FIG. 3 illustrates a cross-sectional view of a transistor with a bulb-type recessed channel in accordance with a first embodiment of the present invention.

FIG. 3 illustrates a cross-sectional view of a transistor with a bulb-type recessed channel in accordance with a first embodiment of the present invention. The transistor with the bulb-type recessed channel includes an isotropically etched substrate 21B, a bulb-type recessed region including a trench pattern 24 and a ball pattern 26 formed over the isotropically etched substrate 21B, a gate insulating layer 27 formed over the surface profile of the substrate 21B and the bulb-type recessed region, and a vacancy-removed first gate conductive layer 28A formed over the gate insulating layer 27. Vacancies are removed from a first gate conductive layer 28 (FIG. 4G) using a thermal treatment. A second gate conductive layer 29 is formed over the vacancy-removed first gate conductive layer 28A and fills in the bulb-type recessed region.

Specifically, the first gate conductive layer 28 and the second gate conductive layer 29 include silicon layers. The silicon layer is formed in an amorphous structure or a crystalline structure. Furthermore, the silicon layer may be doped with impurities in a subsequent process or may be doped in-situ. The impurities may include boron (B) or phosphorus (P) and a concentration of the impurities is in a range of approximately $1\times10^{19}$ atoms/cm$^3$ to approximately $5\times10^{20}$ atoms/cm$^3$. A total thickness of a first thickness of the first gate conductive layer 28 and a second thickness of the second gate conductive layer 29 is sufficient to close an opening of the bulb-type recessed region. The first thickness of the first gate conductive layer 28 is smaller than half of a width of the opening for the bulb-type recessed region. Thus, forming the first gate conductive layer 28 having the first thickness does not form a void in the bulb-type recessed region.

Furthermore, vacancies in the first gate conductive layer 28 are removed by performing the thermal treatment in a furnace. The thermal treatment is performed at a temperature ranging from approximately 600° C. to approximately 1,200° C., and under a low pressure of approximately 10 mTorr or less or a normal pressure of approximately 760 Torr. The thermal treatment is performed in an inert gas atmosphere or an oxidization gas atmosphere. For example, the inert gas includes nitrogen ($N_2$) or argon (Ar) and the oxidization gas includes oxygen ($O_2$) and ozone ($O_3$) gases.

The vacancy-removed first gate conductive layer 28A and the second gate conductive layer 29 that form a gate electrode include substantially the same material. However, since the thermal treatment has been performed on the first gate conductive layer 28, the vacancies melted in the first gate conductive layer 28 may be removed and a discontinuous interface 30 is formed between the vacancy-removed first gate conductive layer 28A and the second gate conductive layer 29. Thus, although a void is formed while forming the second gate conductive layer 29, growing and moving of the void due to a subsequent thermal process can be reduced.

FIGS. 4A to 4I illustrate cross-sectional views of a method for fabricating a transistor with a bulb-type recessed channel in accordance with the first embodiment of the present invention.

Figure 4A:
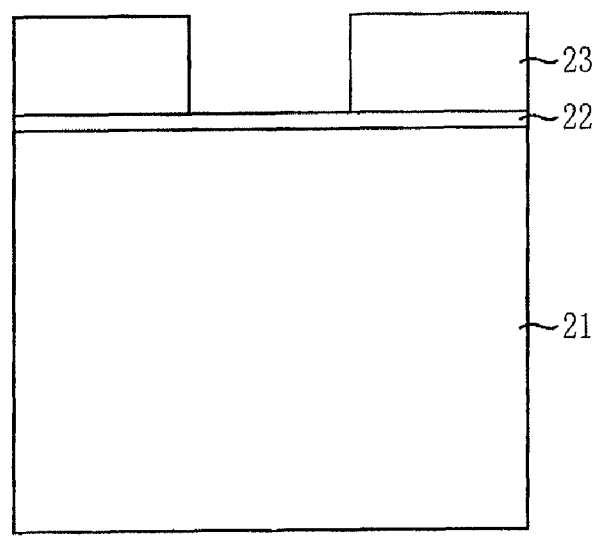
FIGS. 4A to 4I illustrate cross-sectional views of a method for fabricating the transistor with the bulb-type recessed channel in accordance with the first embodiment of the present invention.

Referring to FIG. 4A, a hard mask 22 is formed over a substrate 21 including an isolation structure (not shown). The silicon layer 21 includes a silicon layer. The hard mask 22 will be used in a subsequent etch process for forming a bulb-type recessed channel. The hard mask 22 includes a dielectric layer, such as a silicon dioxide ($SiO_2$) layer. A mask pattern 23 is formed over the hard mask 22. The mask pattern 23 includes a photoresist pattern.

Figure 4B:
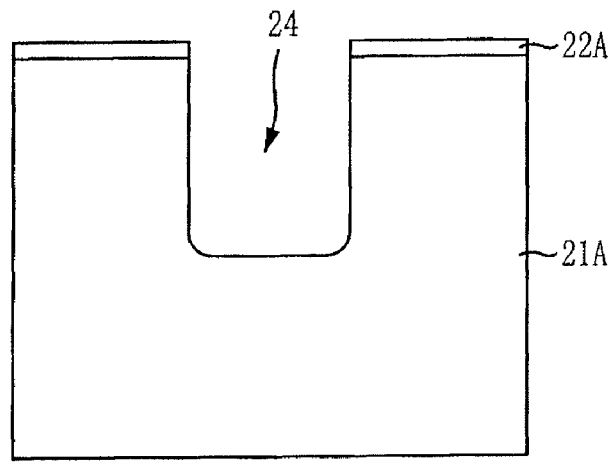

Referring to FIG. 4B, the hard mask 22 is etched using the mask pattern 23 as an etch mask. The substrate 21 exposed after etching the hard mask 22 is etched to form a trench pattern 24 of the bulb-type recessed region. The trench pattern 24 has a width ranging from approximately 100 Å to approximately 200 Å. The mask pattern 23 may be removed after the trench pattern 24 is formed. Reference numeral 21A and 22A refer to an etched substrate 21A and a remaining hard mask pattern 22A, respectively.

Figure 4C:
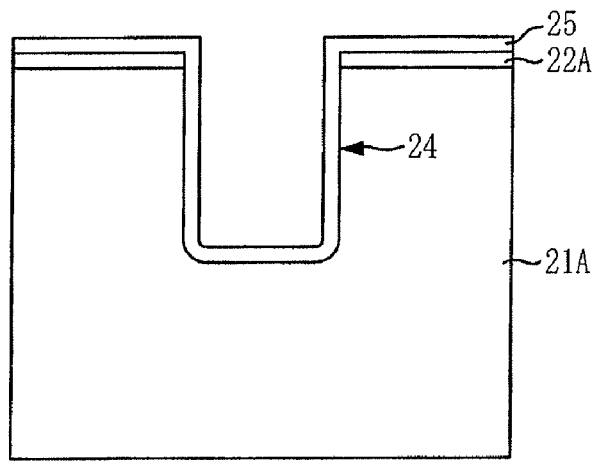

Referring to FIG. 4C, a spacer dielectric layer 25 is formed over the trench pattern 24 and the remaining hard mask pattern 22A. The spacer dielectric layer 25 may include a silicon dioxide ($SiO_2$), a silicon nitride ($Si_3N_4$), a silicon oxynitride (SiON), or a combination thereof. The spacer dielectric layer 25 has a thickness ranging from approximately 30 Å to approximately 150 Å.

Figure 4D:
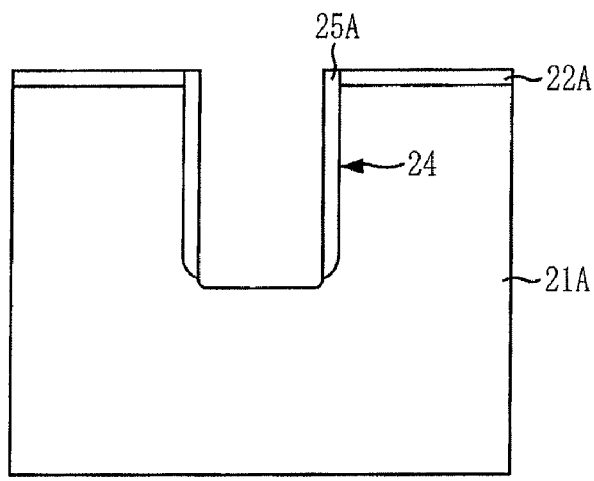

Referring to FIG. 4D, a portion of the spacer dielectric layer 25 is etched such that an etched spacer dielectric layer 25A remains over the sidewalls of the trench pattern 24 and the remaining hard mask pattern 22A. The spacer dielectric layer 25 is vertically etched using an etch-back process. Consequently, an upper portion of the remaining hard mask pattern 22A and a bottom portion of the trench pattern 24 are exposed by the etch-back process, and the etched spacer dielectric layer 25A remains over the sidewalls of the trench pattern 24 and the remaining hard mask pattern 22A. A portion of the remaining hard mask pattern 22A may be removed during the etch-back process on the spacer dielectric layer 25.

Figure 4E:
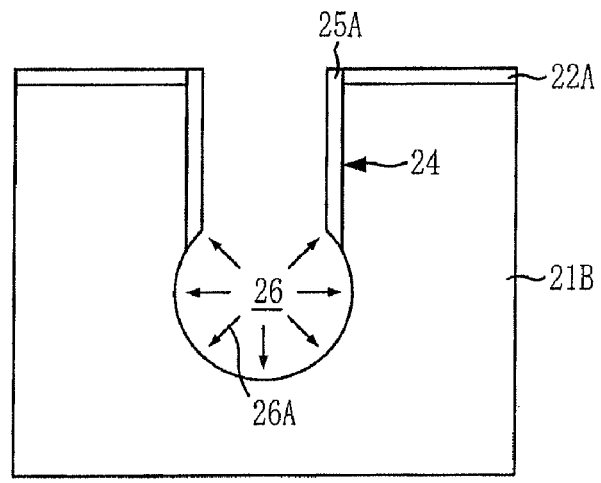

Referring to FIG. 4E, an isotropic etching 26A is performed on the exposed bottom surface of the trench pattern 24 to form a ball pattern 26. The isotropic etching 26A is performed using tetrafluoromethane ($CF_4$) and $O_2$ plasma. Reference numeral 21B refers to an isotropically etched substrate 21B.

Figure 4F:
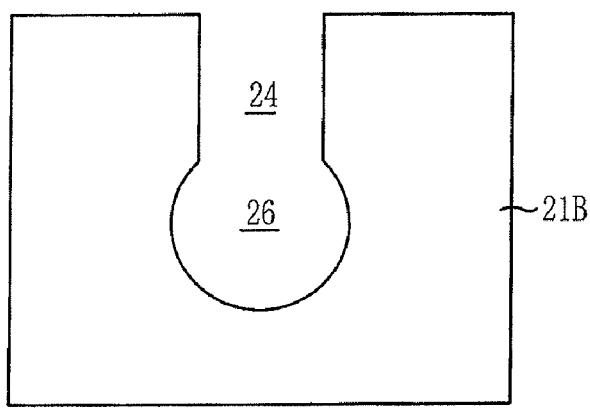

Referring to FIG. 4F, the etched spacer dielectric layer 25A and the remaining hard mask pattern 22A are removed using a wet cleaning process. When the etched spacer dielectric layer 25A and the remaining hard mask pattern 22A include oxide, a solution including hydrogen fluoride (HF) is used in the removal. When the etched space dielectric layer 25A and the remaining hard mask pattern 22A include nitride, a solution including phosphoric acid ($H_3PO_4$) is used in the removal. After the wet cleaning process, a bulb-type recessed region including the trench pattern 24 and the ball pattern 26 is formed. A width of the ball pattern 26 is wider than that of the trench pattern 24.

Figure 4G:
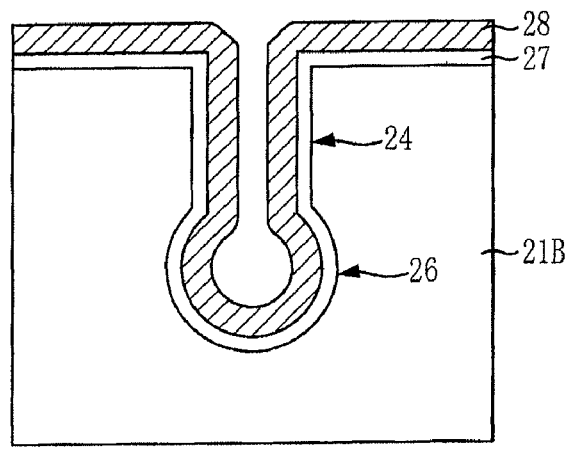

Referring to FIG. 4G, a gate insulating layer 27 is formed. The gate insulating layer 27 may include $SiO_2$, $Si_3N_4$, SiON, a hafnium silicate (Hf-silicate), a hafnium-silioxynitride (Hf—SiON) or a combination thereof.

A first gate conductive layer 28 having a given thickness is formed over the gate insulating layer 27. The first gate conductive layer 28 is formed to a thickness that may not close the trench pattern 24, which is an opening of the bulb-type recessed region. Thus, a void may not be formed.

For example, the first gate conductive layer 28 includes a silicon layer. The silicon layer is formed at a temperature ranging from approximately 450° C. to approximately 650° C. The silicon layer is formed in an amorphous structure or a crystalline structure. Furthermore, the silicon layer may be doped with impurities in a subsequent process or may be doped in-situ. The impurities may include boron (B) or phosphorus (P), and a concentration of the impurities is in a range of approximately $1\times10^{19}$ atoms/cm$^3$ to approximately $5\times10^{20}$ atoms/cm$^3$.

Figure 4H:
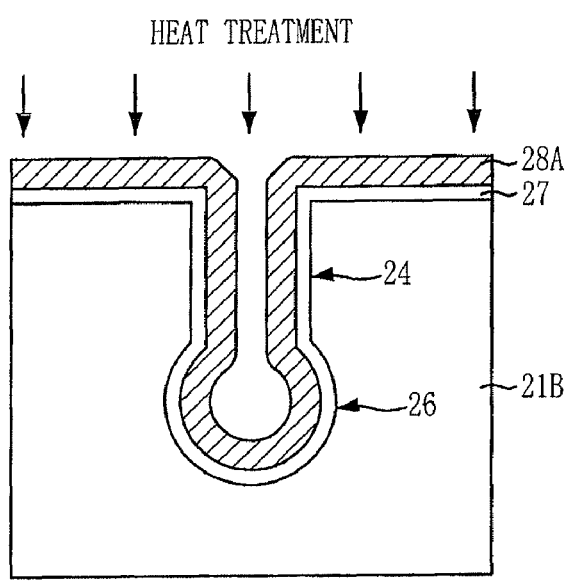

Referring to FIG. 4H, a thermal treatment is performed to diffuse out vacancies melted in equilibrium inside the first gate conductive layer 28. The thermal treatment is performed at a temperature ranging from approximately 600° C. to approximately 1,200° C. and under a low pressure of approximately 10 mTorr or less or a normal pressure of approximately 760 Torr in a furnace. The thermal treatment is performed in an inert gas atmosphere or an oxidization gas atmosphere. For example, the inert gas includes $N_2$ gas or Ar gas and the oxidization gas includes $O_2$ and $O_3$ gases.

Therefore, a vacancy-removed first gate conductive layer 28A with reduced vacancies is formed by the thermal treatment. A temperature for the thermal treatment is higher than temperatures used for forming the first gate conductive layer 28 and a subsequent second gate conductive layer 29.

When an insulation material is formed during the thermal treatment, a cleaning process is additionally performed to remove the insulation material. The cleaning process includes a wet cleaning process or a dry cleaning process. The cleaning process may be omitted when the insulation material is not generated over the vacancy-removed first gate conductive layer 28A.

Figure 4I:
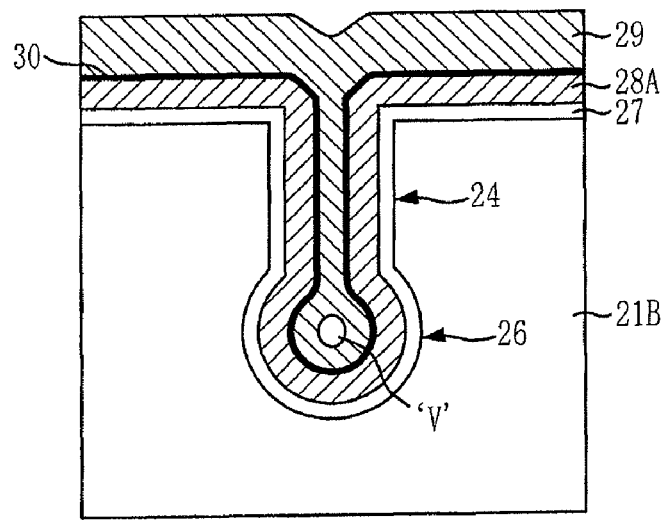

Referring to FIG. 4I, the second gate conductive layer 29 is formed over the vacancy-removed first gate conductive layer 28A until the bulb-type recessed region is filled. The second gate conductive layer 29 includes substantially the same material as the vacancy-removed first gate conductive layer 28A. For example, the second gate conductive layer 29 includes a silicon layer doped with impurities. The impurities may include boron (B) or phosphorous (P), and a concentration of the impurities is in a range of approximately $1\times10^{19}$ atoms/cm$^3$ to approximately $5\times10^{20}$ atoms/cm$^3$. The second gate conductive layer 29 is formed at a temperature ranging from approximately 450° C. to approximately 650° C.

The first embodiment includes forming the gate conductive layer by forming the two divided gate conductive layers having a predetermined thickness. The thermal treatment is performed between the formations of the divided gate conductive layers to prevent growing and moving of the void due to the subsequent thermal process. When the gate conductive layer is formed using two steps, a thickness of the first gate conductive layer 28 formed in the first step may not be limited to half of the total thickness. The first gate conductive layer 28 may be formed to a thickness that does not generate voids.

In accordance with the first embodiment of the present invention, although the void is generated while the second gate conductive layer 29 is formed, the thermal treatment is performed after forming the first gate conductive layer 28 to diffuse the vacancies out, thereby preventing growing and moving of the void due to the subsequent thermal process. Furthermore, the thermal treatment is performed after forming the first gate conductive layer 28 to form the discontinuous interface 30 between the vacancy-removed first gate conductive layer 28A and the second gate conductive layer 29. The discontinuous interface 30 also reduces growing and moving of the void due to the subsequent thermal process.

Figure 5:
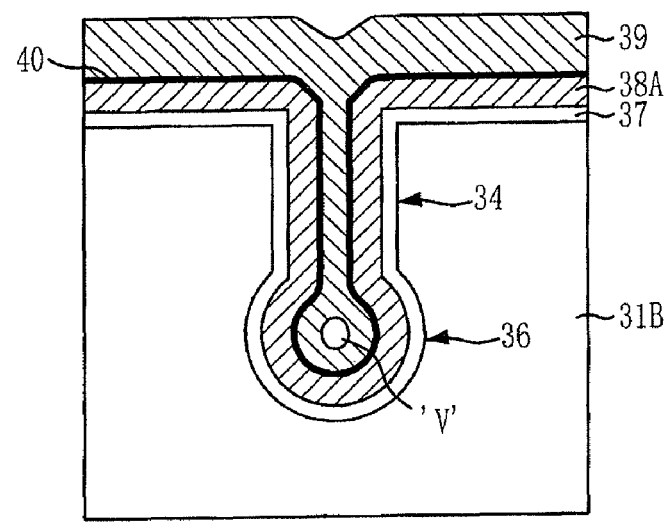
FIG. 5 illustrates a cross-sectional view of a transistor with a bulb-type recessed channel in accordance with a second embodiment of the present invention.

FIG. 5 illustrates a cross-sectional view of a transistor with a bulb-type recessed channel in accordance with a second embodiment of the present invention. The transistor with the bulb-type recessed channel includes an isotropically etched substrate 31B, a bulb-type recessed region including a trench pattern 34 and a ball pattern 36 formed over the isotropically etched substrate 31B, a gate insulating layer 37 formed over the surface profile of the isotropically etched substrate 31B and the bulb-type recessed region, a vacancy-removed first gate conductive layer 38A formed over the gate insulating layer 37, and a second gate conductive layer 39 formed over the vacancy-removed first gate conductive layer 38A. The second gate conductive layer 39 fills in the bulb-type recessed channel.

Specifically, the vacancy-removed first gate conductive layer 38A and the second gate conductive layer 39 include silicon layers doped with impurities. The impurities may include boron (B) or phosphorus (P), and a concentration of the impurities is in a range of approximately $1\times10^{19}$ atoms/cm$^3$ to approximately $5\times10^{20}$ atoms/cm$^3$.

A discontinuous interface 40 is generated between the vacancy-removed first gate conductive layer 38A and the second gate conductive layer 39. The discontinuous interface 40 is generated due to temporarily stopping a supply of a source gas while forming a first gate conductive layer 38 (FIG. 6G) and the second gate conductive layer 39. A formation temperature is maintained uniformly when the supply of the source gas is temporarily stopped, thereby generating a thermal treatment effect on the first gate conductive layer 38. The thermal treatment effect is substantially the same as the one shown in the first embodiment of the present invention.

A total thickness of a first thickness of the vacancy-removed first gate conductive layer 38A and a second thickness of the second gate conductive layer 39 is sufficient to close an opening of the bulb-type recessed region. The first thickness of the vacancy-removed first gate conductive layer 38A is smaller than half of a width of the opening for the bulb-type recessed region. Thus, forming the vacancy-removed first gate conductive layer 38A having the first thickness may not form the void in the bulb-typed recessed region.

The vacancy-removed first gate conductive layer 38A and the second gate conductive layer 39 that form a gate electrode includes substantially the same material, and the discontinuous interface 40 is formed between the vacancy-removed first gate conductive layer 38A and the second gate conductive layer 39. Thus, although the void is formed while forming the second gate conductive layer 39, growing and moving of the void due to the subsequent thermal process can be prevented.

A method to stop the supply of the source gas and a method for forming the discontinuous interface in accordance with the method of stopping the supply of the source gas will be described hereinafter.

FIGS. 6A to 6H illustrate cross-sectional views of a method for fabricating a transistor with a bulb-type recessed channel in accordance with a second embodiment of the present invention.

Figure 6A:
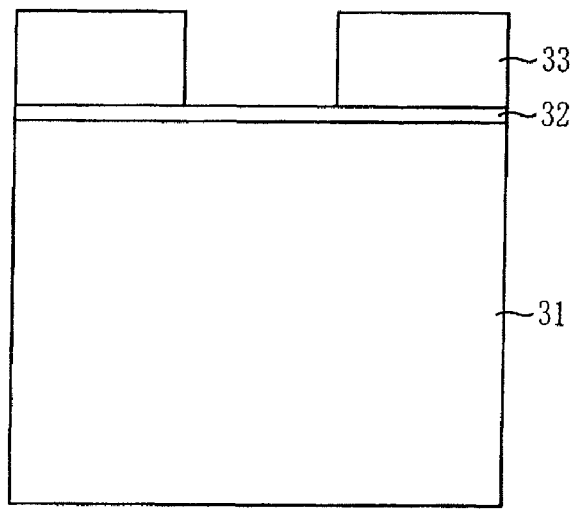
FIGS. 6A to 6H illustrate cross-sectional views of a method for fabricating the transistor with the bulb-type recessed channel in accordance with the second embodiment of the present invention.

Referring to FIG. 6A, a hard mask 32 is formed over a substrate 31 including an isolation structure (not shown). The hard mask 32 will be used in a subsequent etch process for forming a bulb-type recessed channel. The hard mask 32 includes a dielectric layer, such as silicon dioxide ($SiO_2$) layer. A mask pattern 33 is formed over the hard mask 32. The mask pattern 33 includes a photoresist pattern.

Figure 6B:
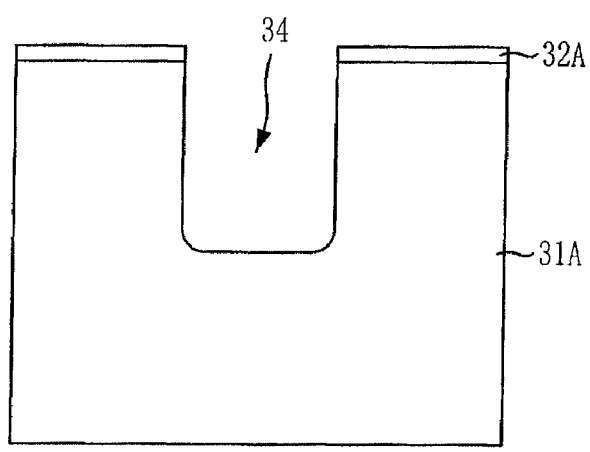

Referring to FIG. 6B, the hard mask 32 is etched using the mask pattern 33 as an etch mask. The substrate 31 exposed after etching the hard mask 32 is etched to form a trench pattern 34 of the bulb-type recessed region. The trench pattern 34 has a width ranging from approximately 100 Å to approximately 200 Å. The mask pattern 33 may be removed after the trench pattern 34 is formed. Thus, the hard mask pattern 32A can be used as the etch barrier. Reference numeral 31A refers to an etched substrate 31A.

Figure 6C:
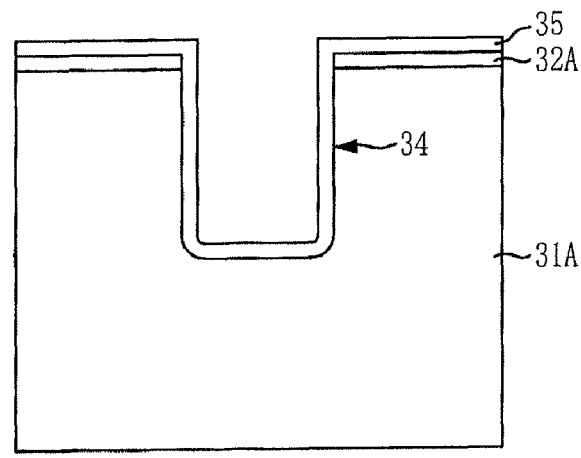

Referring to FIG. 6C, a spacer dielectric layer 35 is formed over the remaining hard mask pattern 32A and the trench pattern 34. The spacer dielectric layer 35 may include a silicon dioxide ($SiO_2$), a silicon nitride ($Si_3N_4$), a silicon oxynitride (SiON), or a combination thereof. The spacer dielectric layer 35 has a thickness ranging from approximately 30 Å to approximately 150 Å.

Figure 6D:
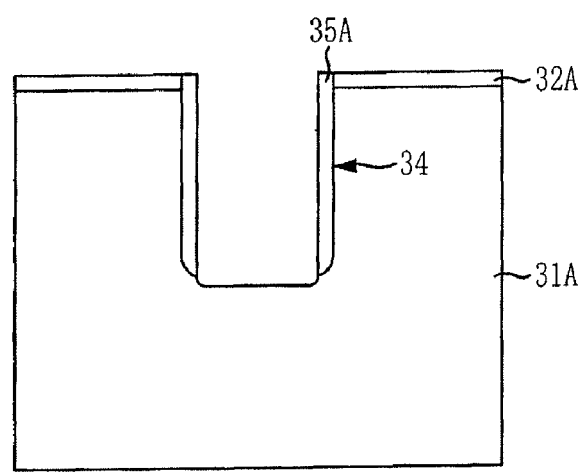

Referring to FIG. 6D, a portion of the spacer dielectric layer 35 is etched such that an etched spacer dielectric layer 35A remains over the sidewalls of the trench pattern 34 and the remaining hard mask pattern 32A. The spacer dielectric layer 35 is vertically etched by an etch-back process. Consequently, an upper portion of the remaining hard mask pattern 32A and a bottom portion of the trench pattern 34 are exposed by the etch-back process, and the etched spacer dielectric layer 35A remains over the sidewalls of the trench pattern 34 and the remaining hard mask pattern 32A. Portions of the remaining hard mask pattern 32A may be removed during the etch-back process on the spacer dielectric layer 35.

Figure 6E:
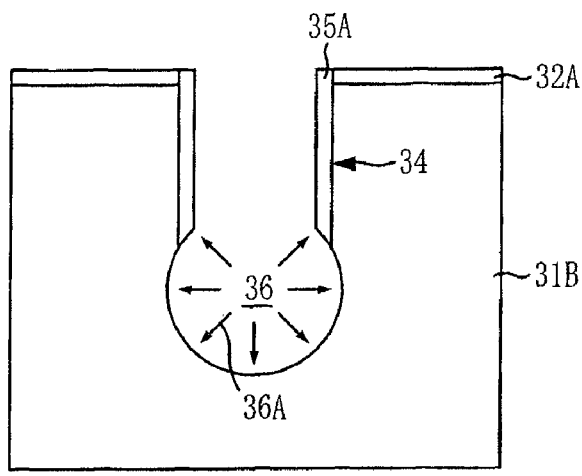

Referring to FIG. 6E, an isotropic etching 36A is performed on the exposed bottom surface of the trench pattern 34 to form a ball pattern 36. The isotropic etching 36A is performed using tetrafluoromethane ($CF_4$) and $O_2$ plasma. Reference numeral 31B refers to an isotropically etched substrate 31B.

Figure 6F:
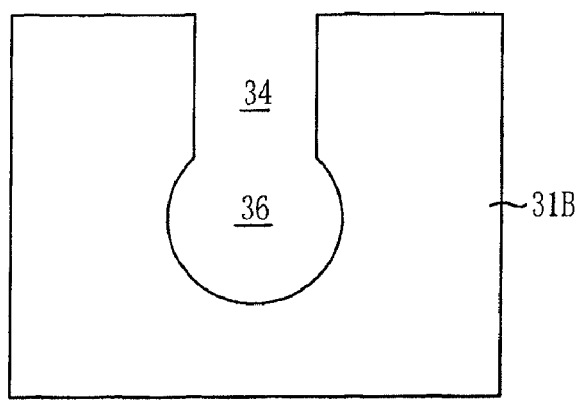

Referring to FIG. 6F, the etched spacer dielectric layer 35A and the remaining hard mask pattern 32A are removed using a wet cleaning process. When the etched spacer dielectric layer 35A and the remaining hard mask pattern 32A includes oxide, a solution including hydrogen fluoride (HF) is used in the removal process. When the etched space dielectric layer 35A and the remaining hard mask pattern 32A include nitride, a solution including phosphoric acid ($H_3PO_4$) is used in the removal process. After the wet cleaning process, a bulb-type recessed region including the trench pattern 34 and the bulb pattern 36 is formed. A width of the bulb pattern 36 is wider than that of the trench pattern 34.

Figure 6G:
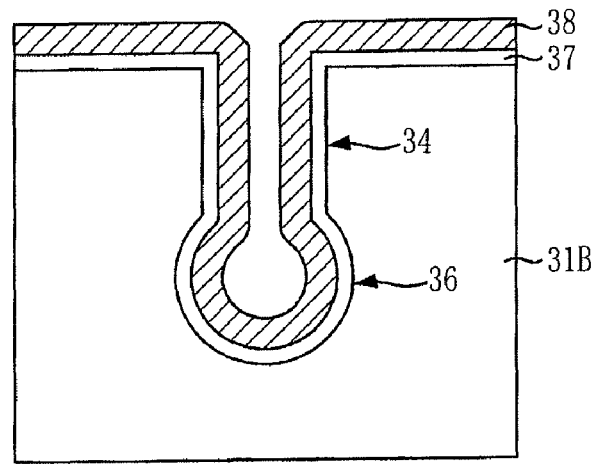

Referring to FIG. 6G, a gate insulating layer 37 is formed over the profile of the bulb-type recessed region and the isotropically etched substrate 31B. The gate insulating layer 37 may include $SiO_2$, $Si_3N_4$, SiON, a hafnium silicate (Hf-silicate), a hafnium silioxynitride (Hf-silioxynitride, Hf—Si—ON), or a combination thereof.

A first gate conductive layer 38 includes a silicon layer. The silicon layer is formed in an amorphous structure or a crystalline structure. Furthermore, the silicon layer may be doped with impurities in a subsequent process or may be doped in-situ. The impurities may include boron (B) or phosphorus (P), and a concentration of the impurities is in a range of approximately $1 \times 10^{19}$ atoms/cm$^3$ to approximately $5 \times 10^{20}$ atoms/cm$^3$. The first gate conductive layer 38 is formed at a temperature in a range of approximately 450° C. to approximately 650° C.

The first gate conductive layer 38 having a given thickness is formed. The first gate conductive layer 38 is formed to a thickness that may not close the trench pattern 34, which is an opening of the bulb-type recessed region. Thus, a void may not be formed. Therefore, the first thickness for the first gate conductive layer 38 is formed to a thickness smaller than half of the width of the trench pattern 34. The first gate conductive layer 38 is formed by supplying a purge gas, a source gas, and a doping gas.

Figure 6H:
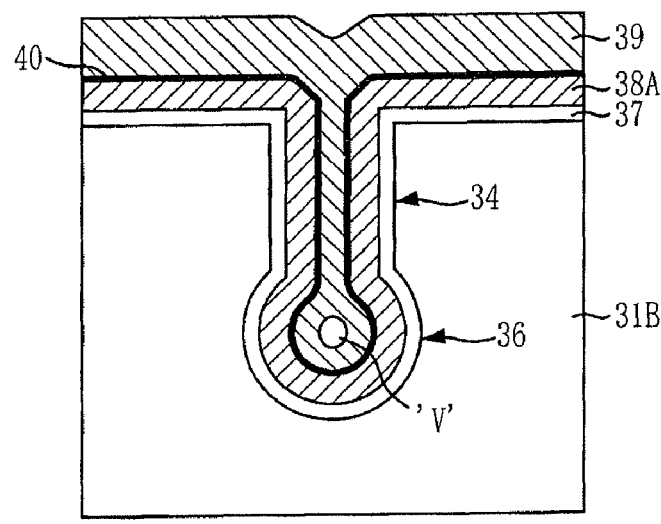

Referring to FIG. 6H, the second gate conductive layer 39 is formed over the vacancy-removed first gate conductive layer 38A until the bulb-type recessed region is filled. The second gate conductive layer 39 includes substantially the same material as the vacancy-removed first gate conductive layer 38A. For example, the second conductive layer 39 includes a silicon layer. The silicon layer is formed in an amorphous structure or a crystalline structure. Furthermore, the silicon layer may be doped with impurities in a subsequent process or may be doped in-situ. The impurities include boron (B) or phosphorous (P) and a concentration of the impurities is in a range of approximately $1 \times 10^{19}$ atoms/cm$^3$ to approximately $5 \times 10^{20}$ atoms/cm$^3$. The second gate conductive layer 39 is formed at a temperature ranging from approximately 450° C. to approximately 650° C.

The second embodiment includes forming the gate conductive layer by forming the two divided gate conductive layers having a predetermined thickness. Supply of the source gas used for formation of the gate conductive layer is temporarily stopped between the formations of the divided gate conductive layer. When the gate conductive layer is formed using two steps, a thickness of the first gate conductive layer formed in the first step may not be limited to half of the total thickness. The first gate conductive layer may be formed to a thickness that does not generate voids.

Forming the second gate conductive layer 39 is performed in substantially the same sequence as the one performed to form the first gate conductive layer 38. However, the supply of the source gas is temporarily stopped before forming the second gate conductive layer 39 to form the discontinuous interface 40 between the first gate conductive layer 38 and the second gate conductive layer 39 and to provide a thermal treatment effect on the first gate conductive layer 38, simultaneously.

The methods for forming the vacancy-removed first gate conductive layer 38A and the second gate conductive layer 39 in accordance with the second embodiment of the present invention are described in more detail hereinafter, referring to FIGS. 6G and 6H.

The substrate 31 including the gate insulating layer 37 is loaded inside of a chamber. A temperature inside the chamber is raised to range from approximately 450° C. to approximately 650° C. The temperature inside the chamber is maintained until the second gate conductive layer 39 is formed. The source gas includes a silicon compound gas. The silicon compound gas is supplied for a given period of time, and the first gate conductive layer 38 is formed. For example, the silicon compound gas includes a silane ($SiH_4$) gas. A purge gas and a doping gas may be supplied with the source gas at substantially the same time. The purge gas is used for removing by-products and the doping gas is used for doping the impurities in the silicon layer in-situ. Furthermore, the purge gas is continuously supplied in the chamber before loading the substrate to provide a deposition atmosphere. A flow rate of the purge gas may be reduced in a subsequent source gas supply.

The supply of the source gas is temporarily stopped after forming the first gate conductive layer 38. Specifically, as the supply of the source gas is temporarily stopped, the formation of the first gate conductive layer 38 is also stopped. Thus, a thermal treatment is performed on the first gate conductive layer 38 due to the temperature in the chamber ranging from approximately 450° C. to approximately 650° C.

After temporarily stopping the supply of the source gas, the source gas is supplied again into the chamber to form the second gate conductive layer 39. Forming the second gate conductive layer 39 includes supplying the source gas again into the chamber. The vacancy-removed first gate conductive layer 38A and the second gate conductive layer 39 that form a gate electrode include substantially the same material.

As the source gas is supplied again into the chamber to form the second gate conductive layer 39 after temporarily stopping the supply of the source gas, a discontinuous interface 40 is generated between the vacancy-removed first gate conductive layer 38A and the second gate conductive layer 39. Because the thermal treatment is performed after forming the first gate conductive layer 38, the discontinuous interface 40 is formed inside the gate conductive layer.

In accordance with the second embodiment of the present invention, the vacancies in the first gate conductive layer 38 are removed as the first gate conductive layer 38 receives the thermal treatment effect after forming the first gate conductive layer 38. Therefore, moving and growing of the void due to the subsequent thermal process is prevented even though the void is generated while forming the second gate conductive layer 39. Furthermore, the discontinuous interface 40 is generated between the vacancy-removed first gate conductive layer 38A and the second gate conductive layer 39 because the supply of the source gas is temporarily stopped. The discontinuous interface 40 may also prevent the void from moving toward the gate insulating layer 37.

FIGS. 7A to 7B illustrate graphs showing a method for temporarily stopping the supply of a source gas in accordance with the second embodiment of the present invention. FIG. 7A illustrates a graph showing a method for temporarily stopping the supply of the source gas and a doping gas at substantially the same time when the source gas, a purge gas, and the doping gas are provided. FIG. 7B illustrates a graph showing a method for temporarily stopping the supply of the source gas when the source gas, the purge gas, and the doping gas are provided. The source gas may include $SiH_4$, the purge gas may include $N_2$ and the doping gas may include phosphine ($PH_3$) or diborane ($B_2H_6$).

Referring to FIGS. 7A and 7B, T1 represents a time for loading the substrate including the bulb-type recessed region and T2 represents a time for increasing the temperature inside the chamber until the temperature reaches a target temperature for the process. T3 represents a time for forming the first gate conductive layer 38 and T4 represents a time for temporarily stopping the formation of the gate electrode. T5 represents a time for forming the second gate conductive layer 39 and T6 represents a time for ending the formation of the second gate conductive layer 39. T3 includes a short period of time to prevent the closing of the trench pattern 34. T4 includes a long period of time to sufficiently perform the thermal treatment on the first gate conductive layer 38. T5 includes a long period of time to sufficiently fill the bulb-type recess region including the trench pattern 34 and the ball pattern 36.

As described above, the thermal treatment for the first gate conductive layer may be sufficiently provided, and the discontinuous interface may be formed between the first gate conductive layer and the second gate conductive layer by controlling the time for temporarily stopping the process.

Even though a void is generated in the bulb-type recessed region, growing and moving of the void due to the subsequent thermal process may be prevented by performing a thermal treatment to diffuse vacancies out and form a discontinuous interface in the bulb-type recessed region, or by temporarily stopping the supply of a source gas while forming a gate conductive layer for use as a gate electrode. Therefore, the above described embodiments of the present invention may produce reliable devices.

While the present invention has been described with respect to specific embodiments, the above embodiments of the present invention are illustrative and not limitative. It will be apparent to those skilled in the art that various changes and modifications may be made without departing from the spirit and scope of the invention as defined in the following claims.

What is claimed is:
1. A semiconductor device comprising:
a substrate;
a bulb-type recessed region formed in the substrate;
a gate insulating layer formed over the bulb-type recessed region and the substrate;
a vacancy-removed first gate conductive layer formed over the gate insulating layer, wherein vacancies melted in equilibrium inside the vacancy-removed first gate conductive layer are diffused out by a thermal treatment;
a second gate conductive layer formed over the vacancy-removed first gate conductive layer to fill in the bulb-type recessed region, and
a discontinuous interface between the vacancy-removed first gate conductive layer and the second gate conductive layer.

2. The semiconductor device of claim 1, wherein a first thickness of the vacancy-removed first gate conductive layer is smaller than half of a width of an opening of the bulb-type recessed region.

3. The semiconductor device of claim 1, wherein the vacancy-removed first gate conductive layer and the second gate conductive layer comprise a silicon layer.

4. The semiconductor device of claim 3, wherein the silicon layer is doped with impurities.

5. The semiconductor device of claim 1, wherein the vacancy-removed first gate conductive layer comprises a silicon layer on which the thermal treatment is performed.

* * * * *